(12) United States Patent
Saran

(10) Patent No.: US 6,232,662 B1
(45) Date of Patent: May 15, 2001

(54) SYSTEM AND METHOD FOR BONDING OVER ACTIVE INTEGRATED CIRCUITS

(75) Inventor: Mukul Saran, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/347,212

(22) Filed: Jul. 2, 1999

Related U.S. Application Data

(60) Provisional application No. 60/092,961, filed on Jul. 14, 1998.

(51) Int. Cl.[7] ....................................................... H01L 23/48
(52) U.S. Cl. ............................................. 257/750; 257/734
(58) Field of Search ..................................... 257/734, 750

(56) References Cited

U.S. PATENT DOCUMENTS 5,220,199 * 6/1993 Owada et al. ..................... 257/773
6,037,668 * 3/2000 Cave et al. ....................... 257/784

* cited by examiner

Primary Examiner—David Mis
(74) Attorney, Agent, or Firm—Gary C. Honeycutt; Fred Telecky; Arthur I. Navarro

(57) ABSTRACT

An architecture and method of fabrication for an integrated circuit having a reinforced bond pad comprising at least one portion of the integrated circuit disposed under the bond pad; and this at least one circuit portion comprises at least one dielectric layer and a patterned electrically conductive reinforcing structure disposed in this at least one dielectric layer.

39 Claims, 3 Drawing Sheets

SYSTEM AND METHOD FOR BONDING OVER ACTIVE INTEGRATED CIRCUITS

This application claims benefit of 60/092,961 filed Jul. 14, 1998.

The present invention is related in general to the field of semiconductor devices, and more specifically to integrated circuits that permit wire bonding to be performed directly over portions of the active circuit area.

BACKGROUND OF THE INVENTION

Two independent trends in semiconductor technology, both with a long history contribute to the urgency for the present invention. The first trend concerns certain processes in the assembly of a semiconductor chip.

It is well known in semiconductor technology that bond pads on silicon integrated circuits can be damaged during wafer probing using fine-tip tungsten needles, further during conventional thermosonic wire bonding to aluminum metallization on the circuits, or during solder ball attachment in chip-to-substrate devices of more recent assembly developments. In wire bonding, particularly suspect are the mechanical loadings and ultrasonic stresses applied by the tip of the bonding capillary to the bond pad. When the damage is not apparent during the bonding process, the defects may manifest themselves subsequently by succumbing to thermo-mechanical stresses generated during the plastic encapsulation, accelerated reliability testing, temperature cycling, and device operation. The damage appears in most cases as microcracks which may progress to fatal fractures in the underlying dielectric material, as chip-outs of brittle or mechanically weak dielectric films, often together with pieces of metal or silicon, or as lifted ball bonds, or as delamination of metal layers.

Recent technological developments in the semiconductor industry tend to aggravate the problem. For instance, newer dielectric materials such as silicon-containing hydrogen silsesquioxane (HSQ) are being preferred due to their lower dielectric constant which helps to reduce the capacitance C in the RC time constant and thus allows higher circuit speed. Since lower density and porosity of dielectric films reduce the dielectric constant, films with these characteristics are introduced even when they are mechanically weaker. Films made of aerogels, organic polyimides, and parylenes fall into the same category. These materials are mechanically weaker than previous standard insulators such as the plasma-enhanced chemical vapor deposited dielectrics. This trend even affects stacks of dielectric layers such as alternating layers of plasma-generated tetraethylorthosilicate (TEOS) oxide and HSQ, or plasma-generated TEOS oxide and ozone-TEOS oxide (which is susceptible to failure much like HSQ). Since these material are also used under the bond pad metal, they magnify the risk of device failure by cracking.

In addition, the spacing between bond pads is being progressively reduced to save valuable silicon real estate. Consequently, the bonding parameters have to become more aggressive to achieve stronger bonds in spite of smaller size. Bonding force and ultrasonic energy during bonding are being increased. Again, the risk of yield loss and lowered reliability is becoming greater.

For conventional bond pad metallization processes, a solution to the aforementioned problems was disclosed in patent application Ser. No. 08/847,239, filed May 1, 1997, titled "System and Method for Reinforcing a Band Pad", assigned to Texas Instruments Incorporated. Some concepts and methods of this disclosure have been subsequently described in a publication entitled "Elimination of Bond-pad Damage through Structural Reinforcement of Intermetal Dielectrics" by M. Saran et al. (Internat. Reliab. Physics Symp., March 1998). In essence, a mechanically strong metal structure serves as a reinforcement for the mechanically weak dielectric layer. The metal is deposited and then etched to form "reservoirs" to be filled with the dielectric material, for example HSQ. For instance, the metal pattern thus formed may include grid-shaped or crucifix-shaped elements. The metal line widths and spacing are structured to confine much of the HSQ into the reservoirs while minimizing the area of each reservoir so that the HSQ layer is spared the direct mechanical impact of the bonding process.

Since HSQ is deposited by a spin-on process, the sizes of the reservoirs have to remain large enough to be filled controllably with the dielectric. This requirement is contrary to the industry trend for continued shrinking of all circuit feature sizes. Furthermore, the industry-wide trend towards smaller dimensions for increasing circuit speed brought the so-called damascene metallization process recently to wide acceptance. In this process flow, an insulator film is formed first; openings such as trenches are then etched into this film. Next, metal such as copper or aluminum is deposited to fill these openings. Whatever metal is deposited elsewhere on the surface, is removed by grinding and polishing, leaving only the metal embedded in the trenches. This process flow, however, is the inverse of the conventional process underlying the above cited patent application.

Wire bonding and solder ball flip-chip bonding over damascene metal pads are facing the same issues (transfer of mechanical and ultrasonic energies to the bond pads and risks of cracking weak dielectric layers) as in the case of conventional metallization. A patent disclosure titled "Fine-Pitch System and Method for Reinforcing Bond Pads in Semiconductor Devicee" (M. Saran et al., May 1998, assigned to Texas Instruments Incorporated) has been submitted for filing. It teaches the design and fabrication process for metal structures made with the damascene technique reinforcing weak dielectrics under the bond pads.

The second trend concerns aspects of manufacturing cost savings by conserving semiconductor "real estate". In order to accommodate balls of bonding wires or solder, typical bond pads on silicon integrated circuits have to be of appropriate size (typically ranging from squares of 80×80 $\mu$m to squares of 150×150 $\mu$m) and therefore consume an area between approximately 1 and 20% of the circuit area, dependent on the number of bond pads and the size of the integrated circuit. For manufacturing and assembly reasons, the bond pads are arranged in rows along the periphery of the circuit, usually stringed along all four chip sides.

Until now, all semiconductor devices manufactured had to exclude the area covered by the bond pads from use for laying out actual circuit patterns because of the high risk of damaging the circuit structures due to the unavoidable forces needed in the bonding process. Evidently, considerable savings of silicon real estate can be obtained if circuit patterns could be allowed to be laid out under the bond pad metal. One way to achieve this would be to create another level of metallization dedicated solely to bond pad formation. This level would be built over a protective overcoat covering an active circuit area. In existing technology, however, a special stress buffer layer of polyimide has to be applied between the protective overcoat and the extra metal layer, as shown by K. G. Heinen et al. ("Wire Bonds over Active Circuits", Proc. IEEE 44th Elect. Comp. Tech. Conf., 1994, pp. 922–928). The cost of applying this polyimide layer has so far prohibited the implementation of the bonds-over-active-circuit concept.

An urgent need has therefore arisen for a low-cost, reliable mass production system and method allowing the manufacture of wire and solder ball bonds directly over active integrated circuits areas. The system should provide stress-free, simple, and no-cost-added bond pads for flexible, tolerant bonding processes even when the bond pads are situated above one or more structurally and mechanically weak dielectric layers. The system and method should be applicable to a wide spectrum of design, material and process variations, leading to significant savings of silicon, as well as improved process yield and device reliability. Preferably, these innovations should be accomplished using the installed process and equipment base so that no investment in new manufacturing machines is needed.

SUMMARY OF THE INVENTION

The present invention is related to high density integrated circuits, especially those having high numbers of metallized inputs/outputs, or "bond pads". These circuits can be found in many device families such as processors, digital and analog devices, memory and logic devices, high frequency and high power devices, and in both large and small area chip categories. The invention saves significant amounts of silicon real estate and thus permits the shrinking of integrated circuit chips. Consequently, the invention helps to alleviate the space constraint of continually shrinking applications such as cellular communications, pagers, hard disk drives, laptop computers and medical instrumentation.

In accordance with the present invention, a bond pad reinforcing system and method are provided which utilize specific portions of the actual integrated circuit as the means to reinforce weak dielectric layers under the bond pad and thus provide a system strong enough to withstand the mechanical forces required in the bonding process. In other words, the bond pad is placed over portions of the actual circuit, which, in turn, serves as the reinforcement needed for damage-free bonding to the bond pad.

Successful reinforcement requires these circuit portions to be designed and fabricated following certain rules developed by finite element stress modeling, and certain guidelines for applying fine-pattern reinforcing structures, so called "dummy" structures. As defined herein the term "dummy" structure refers to reinforcing structures inserted under the bond pad solely for the purpose of mechanical reinforcement without primarily being a portion of the integrated circuit. In general, these reinforcement rules will either limit the maximum area covered by solid blocks of metal and closely spaced metal patterns, and/or specify a much larger minimum metal pitch. For most circuit designs, these rules keep metal line widths to less than 50 $\mu$m and spaces between metal leads to less than 10 $\mu$m. Dummy patterns of similar geometries may serve as reinforcements under bond pads where actual circuit patterns are sparse.

The invention utilizes the sequence of processing steps applied to producing the integrated circuit. For any reinforcing structure, the invention accepts one of the following processing steps. When the damascene metallization process is used, the dielectric layers are deposited first and the trenches etched with design rules typical for integrated circuit features. These fine-pitch openings are then filled with metal such that metal and dielectrics are discretely confined to their respective regions. When the conventional metallization process is used, the metal layer is deposited first and then etched to form "reservoirs" to be filled with the dielectric material (for example, HSQ).

It is an object of the invention to reduce the cost of integrated circuit chips by reducing the silicon area consumed for the overall circuit design; this object is achieved through utilizing the areas underneath the (numerous) bond pads by positioning portions of the actual circuit under the bond pad areas while simultaneously exploiting the structural strength of these circuit portions in order to mechanically reinforce the dielectric layers under the bond pad metal.

Another object of the present invention is to advance the process and operation reliability of semiconductor probing, and wire bonded and solder-attached assemblies by structurally reinforcing the bond pad metallizations even for multilevel architectures under the bond pads.

Another object of the invention is to eliminate restrictions on the processes of probing and of wire bonding and solder attachment, thus minimizing the risks of inflicting cracking damage even to very brittle dielectrics.

Another object of the invention is to provide design and layout concepts and process methods which are flexible so that they can be applied to many families of semiconductor products, and are general, so that they can be applied to several generations of products.

Another object of the invention is to provide a low-cost and high-speed process for fabrication, testing and assembly.

Another object of the invention is to use only designs and processes most commonly used and accepted in the fabrication of integrated circuit devices, thus avoiding the cost of new capital investment and using the installed fabrication equipment base.

These objects have been achieved by the teachings of the invention concerning design concepts and process flows suitable for mass production. Various modifications have been successfully employed to satisfy different selections of product geometries and materials.

In one embodiment of the invention, at least one portion of the integrated circuit is disposed under the bond pad, occupying a substantial area under the bond pad. This circuit portion comprises at least one mechanically weak dielectric layer and a reinforcing patterned metal structure disposed in the dielectric layer. Examples for suitable circuit portions under the bond pad include interconnectors, resistors, capacitors, inductors, and electrostatic discharge structures.

In another embodiment of the invention, the circuit portion under the bond pad contains at least one dielectric stack of multiple dielectric layers; a reinforcing patterned structure of electrically conductive material is disposed in the dielectric stack.

In another embodiment of the invention, at least one portion of the integrated circuit is disposed under the bond pad, comprising a mechanically weak dielectric layer and a reinforcing patterned metal structure, and occupying a substantial area under the bond pad. In addition, another dielectric layer is disposed under the bond pad, containing another reinforcing patterned structure. The reinforcing patterned structure may be a joined or interconnected structure. In yet another embodiment of the invention, the reinforcing patterned structure may comprise disjoined or non-interconnected and repeating elements.

In another embodiment of the invention, a first portion of the integrated circuit is disposed under a portion of the bond pad. Furthermore, additional portions of the integrated circuit are disposed under portions of the bond pad. Each circuit portion comprises at least one weak dielectric layer and a reinforcing patterned structure disposed in the dielectric layer.

In yet another aspect of the invention, a method for reinforcing a bond pad in a semiconductor integrated circuit includes the steps of placing at least one portion of the integrated circuit under the bond pad, and providing this circuit portion with at least one dielectric layer and a reinforcing patterned electrically conductive structure disposed in that at least one dielectric layer. Typically, the reinforcing patterned electrically conductive structure comprises at least one metal layer. The process of providing at least one dielectric layer and at least one reinforcing patterned metal structure comprises in one embodiment of the invention the fabrication sequence of the conventional metallization, yet in another embodiment of the invention the fabrication sequence of the damascene metallization.

The technical advances represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWING

FIG. 1 is a schematic top view of a dummy structure reinforcing the bond pad, made by conventional or damascene metallization processes.

DETAILED DESCRIPTION OF THE PREFERRED EMBODIMENTS

The present invention is related to the input/output (I/O) terminals of integrated circuits, commonly referred to as "bond pads". As defined herein, the term "bond pad" refers to the metallized I/Os of the circuits. A bond pad requires a substantial area of silicon "real estate" (from squares of 80×80 μm to squares of 150×150 μm) in order to serve as a contact to a metal ball in wire bonding or to a solder ball in reflow assembly. In modem circuits, the signal, power and ground needs call for numerous bond pads, ranging in number from 8 to over 1000, causing a significant sacrifice of precious silicon. Furthermore, the processes of wire bonding and solder reflow exert considerable mechanical stress onto the bond pads and their underlying materials so that especially insulators may be threatened by microcracks. The present invention solves both the area and the strength problems of the circuit bond pads.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention. The impact of the present invention can be most easily appreciated by highlighting the limitations of the known technology.

Figure 1:
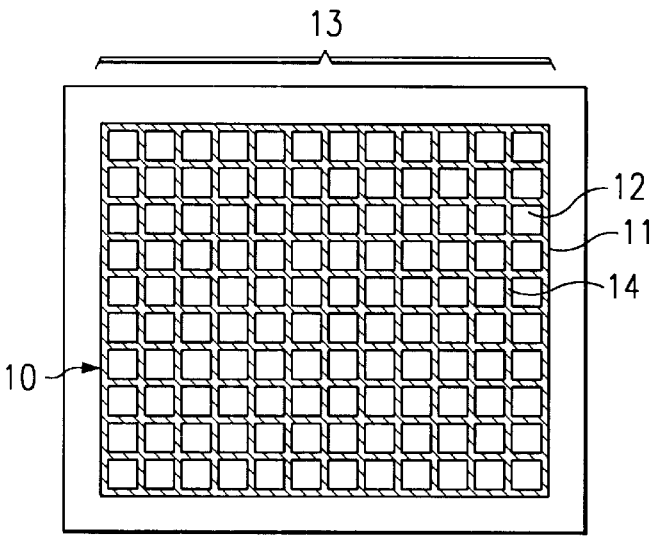
FIG. 1 refers to prior art.

FIG. 1 illustrates an approach in known technology for reinforcing the material, especially the mechanically weak insulators, under the bond pad with the help of metallized structures. FIG. 1 shows a joined or interconnected grid structure 11 (made of metal or electrically conductive material) with a plurality of areas 12 for containing and accommodating a large portion of weak dielectric material herein. Accordingly, reinforcing structure 10 provides support and mechanical strength to the mechanically weak dielectric layer, or layers, so that incidents of cracking, cratering and other bonding-related and testing-related failures caused by wire-bonding, soldering, or probing are substantially suppressed.

By way of example, grid structure 11 may be made of copper. The walls of grid 11 are 0.5 μm thick. The grid may occupy a square-shaped area with side length 13 of 80 μm. If the dielectric material filling areas 12 is a stack of mostly HSQ with a thinner overlayer of oxide, each area 12 is square shaped with side length 14 of 3.0 μm. A variety of reinforcing structures are being used, for instance with or without a plurality of connected structural elements; with or without a plurality of repeating structural elements; in single-layer arrangement or in multi-layered stacks. These reinforcing structures can be fabricated in the process sequence of the standard metallization or the sequence of the damascene metallization.

In contrast to the reinforcing capabilities of metal structures like the one shown in FIG. 1, dummy structures still consume precious silicon area for accommodating the (numerous) bond pads and, therefore, do not address the urgent need to save silicon real estate.

Figure 2:
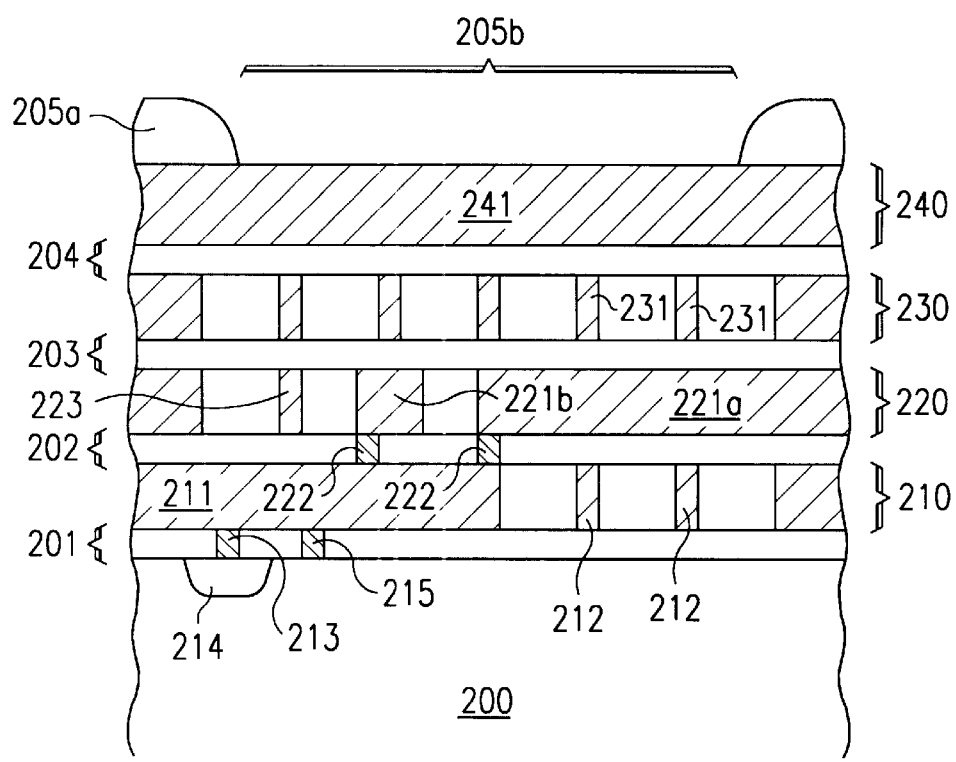
FIG. 2 is a schematic and simplified cross section through a bond pad and its underlying multi-level reinforcing structures, comprising circuit portions and dummy structures according to an embodiment of the invention.

This shortcoming of the known technology is eliminated by the present invention, as illustrated in the example of FIG. 2, depicting schematically a preferred embodiment of the invention. A small portion of an integrated circuit is shown as it is made over silicon substrate 200 and its first oxide 201 (thickness typically in the 200 to 1000 nm range). The hierarchy starts with first metal level 210, which is frequently a sandwich of several metals, for instance sequentially titanium nitride 20 to 40 nm thick, copper-doped aluminum 300 to 600 mn thick, titanium nitride, 20 to 60 nm thick. It is followed by the first interlevel dielectric layer 202, which may be made of a stack of 100 to 600 nm HSQ followed by 400 to 700 nm oxide. The hierarchy is continued with second metal level 220 of similar composition as metal level 210, followed by the second interlevel dielectric layer 203, which again comprises the mechanically weak material HSQ. There is often a third (and fourth, etc.) metal level 230 and a third (and fourth, etc.) interlevel dielectric 204, before the metal level 240 for the bond pad is reached. For the purpose of illustration, these are all shown as identical dielectric stacks, but this does not need to be so.

As defined herein, the term "hierarchy" refers to a stack of insulating and/or electrically conductive layers positioned on top of each other and processed sequentially; The layers may contain features aligned to each other.

Commonly used techniques for depositing the dielectric layers include chemical vapor deposition, sputtering, or spin-on processes. Preferred materials include silicon dioxide, silicon nitride, oxy-nitride, fluoro-silicate glass (FSG), undoped silicate glass (USG), phosphor-silicate glass (PSG), plasma-generated tetraethylortho-silicate oxide (TEOS), and recently silicon-containing hydrogen silsesquioxane (HSQ), or even gels or a foamy substance, or an organic polymeric such as polyimide and parylene. Each material has its preferred regime for application; for instance, silicon nitride stops penetration by water molecules, phosphorus-doped glass offers lower reflow temperatures, HSQ exhibits very low dielectric constant. Often, however, the desirable characteristics are accompanied by undesirable ones; so are HSQ and gels structurally and mechanically weak, and polymerics may require polymerization at elevated temperatures and may be thermally unstable. The thickness of the layers can be varied widely (from 20 to 1000 nm), but is typically quite uniform across a wafer diameter.

Bond pad metal layer 240 typically comprises 400 to 1000 nm copper-doped aluminum, often over a thin (10 to 200 nm) underlayer of titanium (or titanium nitride, titanium-tungsten, tantalum, tantalum nitride, tantalum silicon nitride, tungsten nitride, or tungsten silicon nitride). It is covered by the moisture-impenetrable protective overcoat 205a made of silicon nitride or silicon oxy nitride (commonly 200 to 1000 mn thick). The window 205b (80 to 150 µm wide), opened in the protective overcoat, defines the width of the bond pad 241, which is usually square shaped. The bond pad will receive the ball or wedge of the bonding wire (not shown), mostly gold, copper, or aluminum. If a ball of solder (some mixture of lead and tin, not shown) is to be affixed to the bond pad, it has to receive first an undermetal (not shown) of a thin film of a refractory metal and a film of a noble metal.

The present invention provides system and method of fabrication for the metal layers 210, 220, and 230 under the bond pad area. In FIG. 2, layer 210 comprises portions 211 of the integrated circuit; examples are interconnects, portions of protective structures against electrostatic discharge, precision resistors, capacitors and inductors. These circuit portions 211 occupy only part of the bond pad width; consequently, layer 210 further comprises portions 212 of reinforcing dummy structures, electrically isolated from the circuit patterns, such as described in FIG. 1. For electrical biasing reasons, some parts of the circuit portions may have electrical connections 213 to diffused moats 214 or other connections 215 to the silicon substrate.

Metal layer 220 in FIG. 2 comprises other portions 221a and 221b of the integrated circuit. Examples again include interconnects, portions of protective structures against electrostatic discharge, precision resistors, capacitors and inductors. Care has been taken that the sum of portions 211 and 221 adds up to the complete area of the bond pad 241. It can, therefore, be stated that bond pad 241 is located over active circuitry and does not consume additional silicon real estate. There may be optional electrical connections 222 between circuit portions 211 and 221a and 221b. The balance of metal layer 220 comprises reinforcing dummy structures 223 such as described in FIG. 1.

Figure 6:
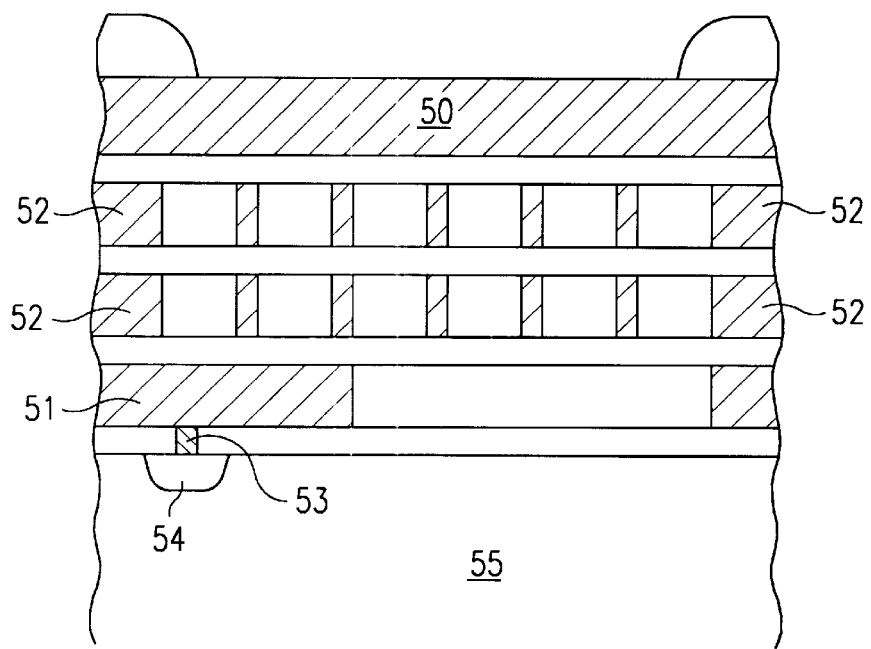
FIG. 6 is a schematic and simplified cross section through a bond pad and its underlying multi-level reinforcing structures, comprising circuit portions and dummy structures.

Another embodiment of the invention, in which not the whole area of the bond pad is located over circuit portions, is described in FIG. 6.

In the embodiment of FIG. 2, metal layer 230 is completely made of reinforcing dummy structures 231, which may, for instance, be a connected grid structure such as described in FIG. 1. By way of example, if the metallization technology of the integrated circuit calls for the damascene process, then layer 230 will be fabricated by depositing the dielectric material first; commonly used techniques include chemical vapor deposition, sputtering, or spin-on process. Preferred materials are ones mentioned above, including the mechanically weak HSQ. Openings or trenches are etched into this layer; commonly used techniques include sputter etching, and plasma etching. Since masks are typically used for this process, the widths of the openings so created follow the trend in the semiconductor industry towards fine feature sizes and fine line pitch. The widths of the openings ranges from approximately 100 to more than 600 nm for lines, and 40 to 150 µm for reservoirs between the lines.

Next, a suitable conductor, semiconductor, or metal such as aluminum (often doped with up to 2% copper and 1% silicon) or copper is deposited (usually by sputtering, electroplating, or chemical vapor deposition over a sputtered seed layer) over the whole surface, filling the openings/ trenches uniformly and forming some blanket over the remainder of the surface. Other examples of conductive materials include a bottom layer made of a stack of titanium/ titanium nitride, followed by a layer of aluminum. Note, if copper is used, the stack to be polished usually consists of tantalum nitride and sputtered copper followed by electroplated copper. The blanket is then carefully removed by grinding and polishing, generating a uniformly flat surface of alternating dielectric and metallic portions. The boundaries between the dielectric and the metallic portions are clearly defined, free of spurious material of either kind infringing onto the nearest neighbor portions.

On the other hand, if the metallization technology of the integrated circuit calls for the conventional metallization process, then layer 230 of FIG. 2 will be fabricated by depositing the metal layer first. Openings, or reservoirs, are then etched into the metal layer and filled with dielectric material. When the dielectric material is semiviscous and allows a spin-on technique for filling the openings/ reservoirs, the size of the opening has to be large enough to ensure proper filling by the semiviscous dielectric material. In the process of filling, the semiviscous material forms a meniscus at the walls of the opening. Further, a thin film of dielectric is deposited on the remainder of the metal surface between the openings. Consequently, the resulting surface is not uniformly flat, and spurious dielectric material remains on the metal surface outside the openings.

Figure 3:
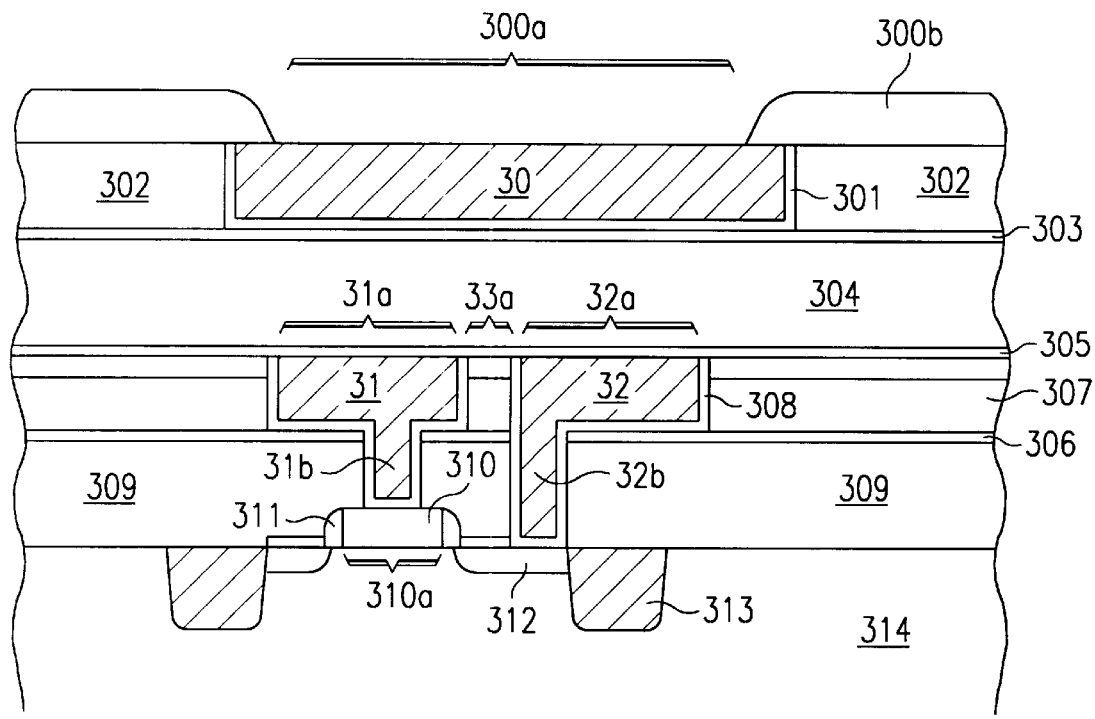
FIGS. 3 and 4 are schematic cross sections of examples of bond pads with underlying reinforcing portions of the integrated circuit in multi-level arrangement.
Figure 4:
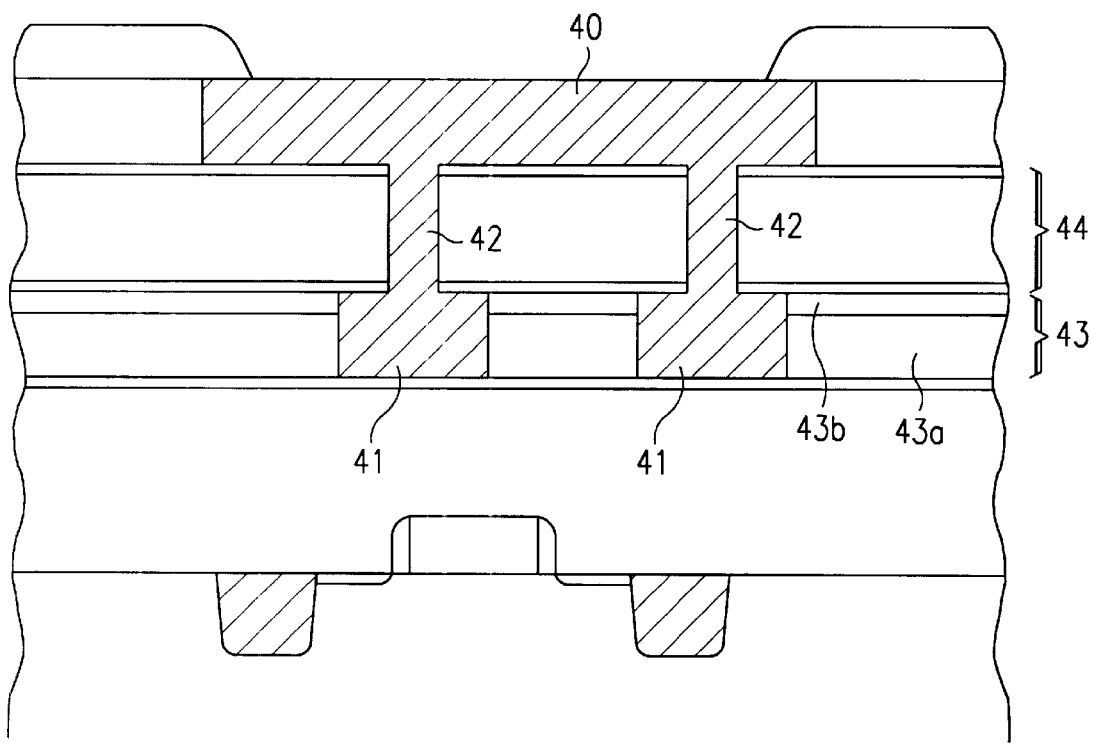

Other preferred embodiments of the present invention are shown in FIGS. 3 and 4. These FIGURES are schematic cross sections through bond pads and the underlying hierarchies of layers reinforcing mechanically weak dielectrics for those applications when active elements of the integrated circuits are placed in the area under the bond pads. Such elements include for example MOS transistors. A comparison of FIG. 3 and FIG. 4 teaches the following design layout rules for successful bond pad reinforcement by active circuit elements:

When the circuit layout includes metal interconnections under the bond pad in addition to the active elements, additional insertion of metal dummy structures may not be necessary to achieve satisfactory reinforcement (example: FIG. 3).

When the circuit layout does not include metal interconnections under the bond pad in addition to the active elements, additional insertion of suitable metal dummy structures is needed to achieve satisfactory reinforcement (example: FIG. 4). An example is the mesh structure of FIG. 1.

Dependent on the choice of metal of a continuous metal for the dummy structure, the maximum dimension of a continuous metal feature has to be determined by finite element strength analysis. In the example of FIG. 1: Maximum width of copper lines 0.5 µm.

Dependent on the choice of dielectric material for the dummy structure, the maximum dimension of a continuous dielectric feature has to be determined by finite element strength analysis. In the example of FIG. 1: HSQ reservoir side length 2.0 µm.

Referring now to FIG. 3, the bond pad 30 consists of an opening 300a (for example, 80 µm wide), etched into protective overcoat 300b (for example, silicon nitride of 500 to 1000 nm thickness), and comprises aluminum or copper about 200 to 1000 nm thick, often with a thin (about 10 to 500 nm) barrier underlayer 301 (made of titanium, titanium nitride, or titanium-tungsten, tantalum, tantalum nitride, tantalum silicon nitride, tungsten nitride, or tungsten silicon nitride). Dielectric layer 302 is typically made of TEOS oxide, silane oxide, FSG, polyimide, or other dielectric with low dielectric constant. Optional layer 303 is made of silicon nitride, silicon oxynitride, silicon carbide, or aluminum nitride (about 20 to 50 nm thick).

Dielectric layer 304, about 200 to 1000 nm thick, comprises any good quality dielectric such as plasma oxide. It may also consist of FSG, USG, PSG oxides, or some polymeric such as polyimide. Layers 305 and 306, about 20 to 50 nm thick, are made of nitride or oxynitride. Dielectric layer 307, about 200 to 1000 nm thick, comprises material with low dielectric constant, such as HSQ, or a stack of oxide (FSG, USG, PSG oxides) and HSQ.

Crucial for the present invention are metal patterns 31 and 32. They are, for instance, circuit interconnects made of copper, with dense layout rules. Widths 31a and 32a can vary from about 0.15 to 50 µm, and spacing 33a is in the 0.1 to 1.0 range. Patterns 31 and 32 may be surrounded by thin barrier layers 308 similar to layer 301. Metal patterns 31 and 32 may exhibit vias 31b and 32b, about 0.1 to 0.5 nm wide, which reach through pre-metal dielectric layer 309 (typically USG or PSG oxides) to various lower levels in order to make electrical connections to other active or passive circuit elements located under the bond pad area. In FIG. 3, via 31b connects to poly-silicon layer 310 (about 100 to 300 nm thick and surrounded by sidewall spacer oxide or nitride 311), and via 32b connects to silicide layer 312. This silicide layer terminates in trench isolation 313, which may be 50 to 300 nm wide and extend 200 to 500 nm deep into silicon substrate 314. The gate width 310a of the MOS transistor is often in the 0.1 to 0.5 µm range, while the overall transistor width is typically 0.5 to 1.0 µm.

Referring now to FIG. 4, the hierarchy of layers, their material compositions and geometries are analogous to those in FIG. 3. In contrast to FIG. 3, though, the embodiment of FIG. 4 does not comprise the dense circuit pattern of metal interconnects (reference numerals 31 and 32) under bond pad 40. It requires, therefore, metal dummy structures 41 to achieve reinforcement. Structure 41 is patterned in dielectric layer 43, which may be a stack of a mechanically weak HSQ layer 43a and an oxide layer 43b. The bond pad may be connected by vias 42 with the metal dummy structure. In this case, the vias 42 traverse the dielectric layer 44, which may be a stack of silicon nitride, oxide (FSG, USG, PSG oxides, or polymeric), and silicon nitride (or oxy-nitride) layers. Vias 42 do not have to be located at the periphery of bond pad 40.

Figure 5:
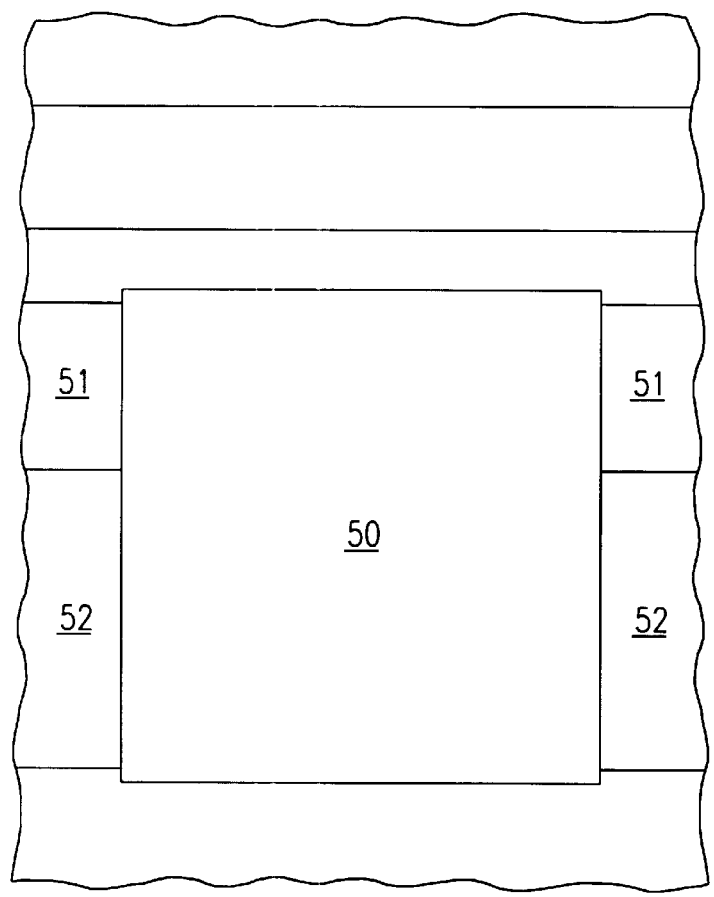
FIG. 5 is a simplified top view of a bond pad overlying circuit portions and dummy structures in a multi-level reinforcing arrangement according to another embodiment of the invention.

As another embodiment of the invention, FIG. 5 shows a simplified top view of a bond pad 50 overlying a multi-level reinforcing hierarchy of layers with circuit portions 51 and dummy structures 52. Using identical reference numerals for the same entities, FIG. 6 illustrates a schematic and simplified cross section through the reinforcing hierarchy of layers. The dummy structures are laid out on two complete levels, while the circuit portion consumes part of the bond pad area on another level. As an example, the circuit portion may constitute part of a protection device against electrostatic discharge, especially its interconnection and resistor parts. Another example are interconnective and resistive portions of the circuit. The circuit portion may optionally be connected by via 53 to moat 54 diffused into the silicon substrate 55.

Materials and geometries of the layers in FIG. 6 are similar to the respective layers in FIG. 2. The major difference between the embodiments of FIG. 6 and FIG. 2 is the restriction of the circuit portions to a level different from the dummy structures. The goal, though, in both cases is to accommodate as many circuit portions as possible under the bond pad area while reinforcing any mechanically weak dielectrics, and, if necessary, achieve optimum reinforcement by adding reinforcing dummy structures. According to the teachings of the invention, this concept can be applied for both conventional metallization and damascene metallization processes.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. An integrated circuit comprising:
   a wire bonded terminal pad;
   at least one portion of said integrated circuit disposed under said bond pad; and
   said portion comprising at least one dielectric layer and a patterned electrically conductive reinforcing structure disposed in said dielectric layer.

2. The integrated circuit according to claim 1 wherein said portion occupies a substantial area under the bond pad.

3. The integrated circuit according to claim 1 wherein said portion includes a mechanically weak dielectric layer.

4. The integrated circuit according to claim 1 wherein said portion includes at least one multi-layered dielectric stack.

5. The integrated circuit according to claim 1 wherein said portion includes a mechanically weak organic layer.

6. The integrated circuit to claim 1 wherein said portion includes at least one electrically conductive structure constructed as a resistor, inductor, or capacitor.

7. The integrated circuit according to claim 1 wherein said portion includes a reinforcing patterned electrically conductive structure made of metal.

8. The integrated circuit according to claim 1 wherein said portion includes at least one electrically conductive structure constructed as an interconnector.

9. The integrated circuit according to claim 1 wherein said portion is connected to said bond pad by at least one via.

10. An integrated circuit comprising:
    a wire bonded terminal pad;
    at least one portion of said integrated circuit disposed under a portion of said bond pad;
    said portion comprising at least one first dielectric layer and a first reinforcing electrically conductive circuit structure disposed in said first dielectric layer;
    at least one second dielectric layer disposed under a portion of said bond pad; and
    a second reinforcing structure disposed in said second dielectric layer.

11. The integrated circuit according to claim 10 wherein said portions of said bond pad are partially the same.

12. The integrated circuit according to claim 10 wherein said portions of said bond pad are entirely the same.

13. The integrated circuit according to claim 10 wherein said portions of said bond pad are entirely different.

14. The integrated circuit according to claim 10 wherein said reinforcing structure occupies a substantial area under the bond pad.

15. The integrated circuit according to claim 10 wherein said second reinforcing structure comprises an electrically conductive material.

16. The integrated circuit according to claim 15 wherein said electrically conductive material is a metal.

17. The integrated circuit according to claim 10 wherein said second dielectric layer includes a mechanically weak dielectric layer.

18. The integrated circuit according to claim 10 wherein said second dielectric layer is at least one multi-layered dielectric stack.

19. The integrated circuit according to claim 10 wherein said second dielectric layer includes a mechanically weak organic layer.

20. The integrated circuit according to claim 10 wherein said first and second dielectric layers are made of the same material.

21. The integrated circuit according to claim 10 wherein said first and second dielectric layers are made of different materials.

22. The integrated circuit according to claim 10 wherein said second reinforcing patterned structure includes a plurality of connected structural elements.

23. The integrated circuit according to claim 10 wherein said second reinforcing patterned structure includes a plurality of repeating structural elements.

24. The integrated circuit according to claim 10 wherein said second reinforcing patterned structure includes a plurality of repeating non-interconnected structural elements.

25. The integrated circuit according to claim 10 wherein said at least one circuit portion is connected to said second reinforcing patterned structure by at least one via.

26. The integrated circuit according to claim 10 wherein said first and said second dielectric layers are the same.

27. A integrated circuit comprising:

a wire bonded terminal pad a first portion of said integrated circuit disposed under a portion of said bond pad;

said first circuit portion comprising at least one first dielectric layer and a first reinforcing electrically conductive circuit structure disposed in said at least one first dielectric layer;

at least one additional portion of said integrated circuit disposed under a portion of said bond pad; and said at least one additional portion comprising at least one second dielectric layer and a second reinforcing electrically conductive circuit structure disposed in said at least one second dielectric layer.

28. The integrated circuit according to claim 27 wherein said portions of said bond pad are partially the same.

29. The integrated circuit according to claim 27 wherein said portions of said bond pad are entirely the same.

30. The integrated circuit according to claim 27 wherein said portions of said bond pad are entirely different.

31. The integrated circuit according to claim 27 wherein said first circuit portion is connected to said at least one additional circuit portion by at least one via.

32. A method for reinforcing a bond pad in a semiconductor integrated circuit comprising:

placing at least one portion of said integrated circuit under said bond pad; and providing said at least one circuit portion with at least one dielectric layer having a reinforcing electrically conductive structure disposed therein.

33. The method according to claim 32 wherein said reinforcing electrically conductive structure comprises a metal.

34. The method according to claim 32 wherein said process of providing said at least one dielectric layer and said reinforcing structure comprises the steps of:

forming a reinforcing layer;

patterning said reinforcing layer in a predetermined area into a portion of a circuit pattern having a plurality of vacant areas;

forming a dielectric layer above the patterned reinforcing layer, filling the vacant areas therein; and forming a bond pad on the dielectric layer above the patterned reinforcing layer.

35. The method according to claim 34 further comprising the process of repeating the reinforcing layer forming, patterning, and dielectric layer forming steps at least one time prior to forming the bond pad thereon.

36. The method according to claim 32 wherein said process of providing said at least one dielectric layer and said reinforcing structure comprises the steps of:

forming a first dielectric layer;

patterning said first dielectric layer in a predetermined area into a portion of a circuit pattern having a plurality of vacant areas;

forming a layer of reinforcing material above said patterned first dielectric layer, filling said vacant areas therein;

removing said reinforcing material except for said filled vacant areas, whereby a uniformly flat surface is formed and said first dielectric layer is transformed into a reinforcing layer;

forming a second dielectric layer above said uniformly flat surface of said reinforcing first dielectric layer, and forming a bond pad on said second dielectric layer above said reinforcing first dielectric layer.

37. The method according to claim 36 further comprising the process of repeating the first dielectric layer forming, patterning, layer of reinforcing material forming, material removing, and second dielectric layer forming steps at least one time prior to forming said bond pad thereon.

38. A method of reinforcing a bond pad in a semiconductor integrated circuit comprising:

placing at least one portion of said integrated circuit under said bond pad;

providing said at least one circuit portion with at least one first dielectric layer and a first reinforcing electrically conductive circuit structure disposed in said at least one dielectric layer;

placing at least one second dielectric layer under said bond pad; and providing a second reinforcing structure disposed in said second dielectric layer.

39. The method according to claim 38 wherein said reinforcing structures comprise metals.

* * * * *